(12) United States Patent
Philippart et al.

(10) Patent No.: US 6,650,137 B2
(45) Date of Patent: Nov. 18, 2003

(54) CIRCUIT FOR MONITORING AN OPEN COLLECTOR OUTPUT CIRCUIT WITH A SIGNIFICANT OFFSET

(75) Inventors: Timothy P Philippart, Orion, MI (US); Mikhail Zarkhin, West Bloomfield, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 76 days.

(21) Appl. No.: 10/122,693

(22) Filed: Apr. 11, 2002

(65) Prior Publication Data

US 2003/0193339 A1 Oct. 16, 2003

(51) Int. Cl.[7] ............................................. G01R 31/26
(52) U.S. Cl. .................................... 324/768; 327/478
(58) Field of Search ................................ 324/768, 765, 324/158.1, 537; 327/478, 419, 108, 307; 326/100

(56) References Cited

U.S. PATENT DOCUMENTS

| | | | |
|---|---|---|---|
| 5,247,207 A | 9/1993 | Wert et al. | |
| 5,374,858 A | * 12/1994 | Elmer | 327/333 |
| 6,107,807 A | 8/2000 | Fluhrer | |
| 6,115,831 A | 9/2000 | Hanf et al. | |
| 6,249,127 B1 | 6/2001 | Fluhrer | |
| 6,377,088 B1 | * 4/2002 | Dumas | 327/112 |

* cited by examiner

*Primary Examiner*—N. Le
*Assistant Examiner*—Amy He
(74) *Attorney, Agent, or Firm*—Edwin W. Bacon, Jr.

(57) ABSTRACT

A monitoring circuit interfacing an open collector output circuit with a voltage offset, wherein the voltage offset exhibited between the monitoring circuit and the open collector output circuit prevents direct interfacing with a digital input of an adjacent digital circuit. The monitoring circuit of the present invention includes, a first bipolar junction transistor (BJT) connected to an open collector output circuit having a first ground. The first bipolar junction has a second ground that is different from the first ground. The first and second ground creates an appreciable voltage offset therebetween when the first BJT interfaces with the open collector output circuit. The monitoring circuit also includes a second BJT connected to the first BJT in a loop configuration so that at least one of the first and second BJTs increases base current drive to its respective BJT. The monitoring circuit of the present invention therefore maximizes a turn-on rate of its adjacent digital circuit.

18 Claims, 3 Drawing Sheets

CIRCUIT FOR MONITORING AN OPEN COLLECTOR OUTPUT CIRCUIT WITH A SIGNIFICANT OFFSET

FIELD OF THE INVENTION

The present invention relates generally to a monitoring circuit for a vehicle module. More particularly, the invention relates to a monitoring circuit for a vehicle module interfacing with an open collector circuit residing within a different module than the module containing the monitoring circuit, wherein there is a significant ground voltage offset between the monitoring circuit and the open collector circuit.

BACKGROUND OF THE INVENTION

A large digital signal system typically includes a plurality of modules which communicate with other modules by transmitting data over a shared signal line. In general, most of these modules interface with at least two other modules which may or may not be under the same limitations and constraints. For example, two different modules residing within a given digital system may be connected to different power supplies and different ground potentials. Such differences in limitations and constraints of two or more different modules may introduce miscommunication between various digital signal modules and may cause erroneous results in a digital signal system. One system which may experience such a difference is a transmitting module having an open collector output circuit and a receiving module having a monitoring circuit. The monitoring circuit of the receiving module interfaces with the open collector output circuit of the transmitting module, and receives an input signal therefrom. These two circuits are described below in greater detail.

FIG. 1 illustrates a typical open collector output circuit 10 contained within a transmitting module of a vehicle. The open collector output circuit 10 includes an input resistor (Rb) 12, a first bipolar junction transistor (BJT) 14, a second BJT 16 and a current limiting resistor (Re) 18. Each of the first and second BJTs 14 and 16, respectively, includes a base junction 28 or 34, an emitter junction 30 or 36, and a collector junction 26 or 32. The base junction 28 of the first BJT 14 is connected to the input resistor (Rb) 12, which transmits an input signal received via the input port 22 from its adjacent circuit. The collector junction 26 of the first BJT 14 provides an output of the open collector output circuit 10 to its adjacent circuit, or a monitoring circuit 50 (FIG. 2) in the present invention. The emitter junction 30 of the first BJT 14 is connected to ground 24 through the current limiting resistor (Re) 18.

The base junction 34 of the second BJT 16 is connected to the emitter junction 30 of the first BJT 14 and the current limiting resistor 18. The collector junction 32 of the second BJT 16 is connected to the input resistor 12 and the emitter junction 36 of the second BJT 16 is connected to a ground 24 of the transmitting module. The current limiting resistor (Re) 18 provides a base-emitter voltage for the second BJT 16 and a voltage offset to the collector of the first BJT 20. In turn, the second BJT 16 provides overcurrent shutdown by shunting the base current of BJT 14.

The open collector output circuit 10 typically interfaces with a monitoring circuit 50 illustrated in FIG. 2. The monitoring circuit 50 includes a first capacitor ($C_1$) 54, which is connected in parallel to the monitoring circuit 50 and receives an input signal from an input port 52. The other end of the first capacitor ($C_1$) 54 is also connected to a RF ground 56. The monitoring circuit 50 also includes an isolation diode 58 connected in series to the monitoring circuit 50. Via the isolation diode 58, a first resistor 60 is connected in series to the input port 52, and receives the input signal therefrom. The first resistor 60 is connected to a second resistor 62 and a second capacitor($C_2$) 66 at node A. A first BJT 70 of the monitoring circuit 50 is also connected at node A to the first and second resistors 60 and 62, respectively, and to the second capacitor ($C_2$) 66. The other ends of the second resistor 62 and the second capacitor ($C_2$) 66 are connected to a DC voltage supply, VDD, and a receiver ground 68, respectively.

The first BJT 70 of the monitoring circuit 50 includes a base junction 86, an emitter junction 84, and a collector junction 88. The base junction 86 of the first BJT 70 is connected to node A. The emitter junction 84 of the first BJT 70 is connected to a third resistor 72 which, in turn, is connected to the voltage supply, VDD. The collector junction 88 of the first BJT 70 is connected to a fourth resistor 74, which is then connected to a second BJT 78 and a fifth resistor 76 at node B. The first BJT 70 provides base drive for the second BJT 78. The other end of the fifth resistor 76 is grounded.

Similarly, the second BJT 78 also includes a base junction 92, an emitter junction 94, and a collector junction 90. The base junction 92 of the second BJT 78 is connected to the first BJT 70 via the fourth resistor 74, and derives base current therefrom. The emitter junction 94 of the second BJT 78 is connected to receiver ground 68. The collector junction 90 of the second BJT 78 is connected to a power supply, VDD, through a sixth resistor 80. The collector junction 90 of the second BJT 78 operates as an output port of the monitoring circuit 50 and provides output signals to its adjacent CMOS transistor input (not shown). The output signal from the output port 82 of the monitoring circuit 50, (or the CMOS INPUT) has a logical one value of less than 0.2×VDD volt for a logic low level and greater than 0.7× VDD volts as a logic high.

When the input signal received from the open collector output circuit 10 is high, there is no current flow through the isolation diode 58 and provides no base current for the first BJT 70 of the monitoring circuit 50. When the first BJT 70 is turned off, the second BJT 78 also gets turned off because there is no base current supplied to the second BJT 78. As will be apparent to one skilled in the art, the second BJT 78, when turned off, induces the monitoring circuit 50 to provide an output signal that is high, or at a logical one, due to the pull-up voltage through the sixth resistor 80.

Contrary to this, when the input signal received from the open collector output circuit 10 is low, or at a logical zero, the current flows from the power supply, VDD, via the second and first resistors 62 and 60, respectively, to the isolation diode 58. The current turns on the first BJT 70, and causes the current to flow from the emitter junction 84 of the first BJT 70 to the collector junction 88 of the first BJT 70. This current flow through the collector junction 88 of the first BJT 70 provides base current for the second BJT 78, which then turns on in a saturation mode. Appropriate values for the third resistor 74 and the input current are selected to minimize the time the second BJT 78 stays in a linear mode. When the second BJT 78 turns on, the monitoring circuit 50 produces an output signal which is low, or at a logical zero. As a result, the current flows from the collector junction 90 of the second BJT 78 to the emitter junction 94 of the second BJT 78.

The monitoring circuit 50 is generally contained within a different module than the module containing the open collector output circuit 10. Thus, there may exist a significant ground differential between the two circuits. The ground differential, together with the increased emitter voltage of the first BJT 14 of the open collector output circuit 10 due to the second BJT 16 as described above, causes the voltage of the open collector output circuit 10 to be in a range of 1–3.5 V (0.2 Vdd–0.7 Vdd) as seen by the monitoring circuit 50.

To be effective, the monitoring circuit 50 must operate in a saturated mode. For the monitoring circuit 50 to operate in a saturated mode, the monitoring circuit 50 must have a predetermined amount of base current supplied to the second BJT 78 from the collector junction 88 of the first BJT 70. Thus, the emitter current must be large enough for the monitoring circuit 50 to operate in a saturated mode within a predetermined period. However, more of the emitter current and/or time is required for the monitoring circuit to operate in a saturated mode due to the ground differential between the monitoring circuit and the open collector output circuit. When the specified amount of emitter current of the first BJT 70 is not supplied within the given period, this ground differential may cause signal noises that induce false signaling, or false edges, at the output 82 of the monitoring circuit 50.

Additionally, the monitoring circuit 50 illustrated in FIG. 2 has poor noise immunity and fails to provide hysteresis. More specifically, the noise causes the monitoring circuit 50 to function as an amplifier rather than a switch when the resistance of the third resistor 72 is above a predetermined threshold. The noise occurring through the single switching point will cause multiple pulses and false signaling at the output 82 of the monitoring circuit 50. Furthermore, the longer the monitoring circuit 50 takes to operate in a non-saturated mode, the more the noise can occur and cause miscommunication.

What is needed is a monitoring circuit that minimizes time when the monitoring circuit is in a linear mode, and reduces noise occurring during the transfer of data signals. Accordingly, it is an object of the present invention to provide a monitoring circuit that maximizes a turn-on rate of a digital circuit receiving an input from the monitoring circuit. It is also an object of the present invention to provide such a monitoring circuit that can be manufactured cost efficiently.

SUMMARY OF THE INVENTION

In accordance with the teachings of the present invention, a monitoring circuit interfacing an open collector output circuit with a voltage offset is provided. Conventionally, the voltage offset exhibited between the monitoring circuit and the open collector output circuit prevented direct interfacing of the monitoring circuit with a digital input of an adjacent digital circuit. In order to solve the above mentioned problem, the monitoring circuit of the present invention includes a first bipolar junction transistor (BJT) connected to an open collector output circuit having a first ground. The monitoring circuit has a second ground that is at a different location than the first ground. The first and second grounds create an appreciable voltage offset therebetween when the monitoring circuit interfaces with the open collector output circuit. The monitoring circuit also includes a second BJT connected to the first BJT in a loop configuration so that at least one of the first and second BJTs increases base current drive to its respective BJT. The monitoring circuit of the present invention therefore maximizes a turn-on rate of its adjacent digital circuit.

It should be understood that both the foregoing general description and the following detailed description are merely exemplary of the invention, and are intended to provide an overview or framework for understanding the nature and characteristic of the invention as it is claimed. The accompanying drawings are included to provide a further understanding of the invention, and are incorporated in and constitute a part of this specification. The drawings illustrate various features and embodiments of the invention, and together with the description serve to explain the principles and operations of the invention.

BRIEF DESCRIPTION OF THE DRAWINGS

Additional objects, advantages, and features of the present invention will become apparent from the following description and appended claims, taken in conjunction with the accompanying drawings in which:

DETAILED DESCRIPTION OF THE PREFERRED EMBODIMENT

Figure 1:
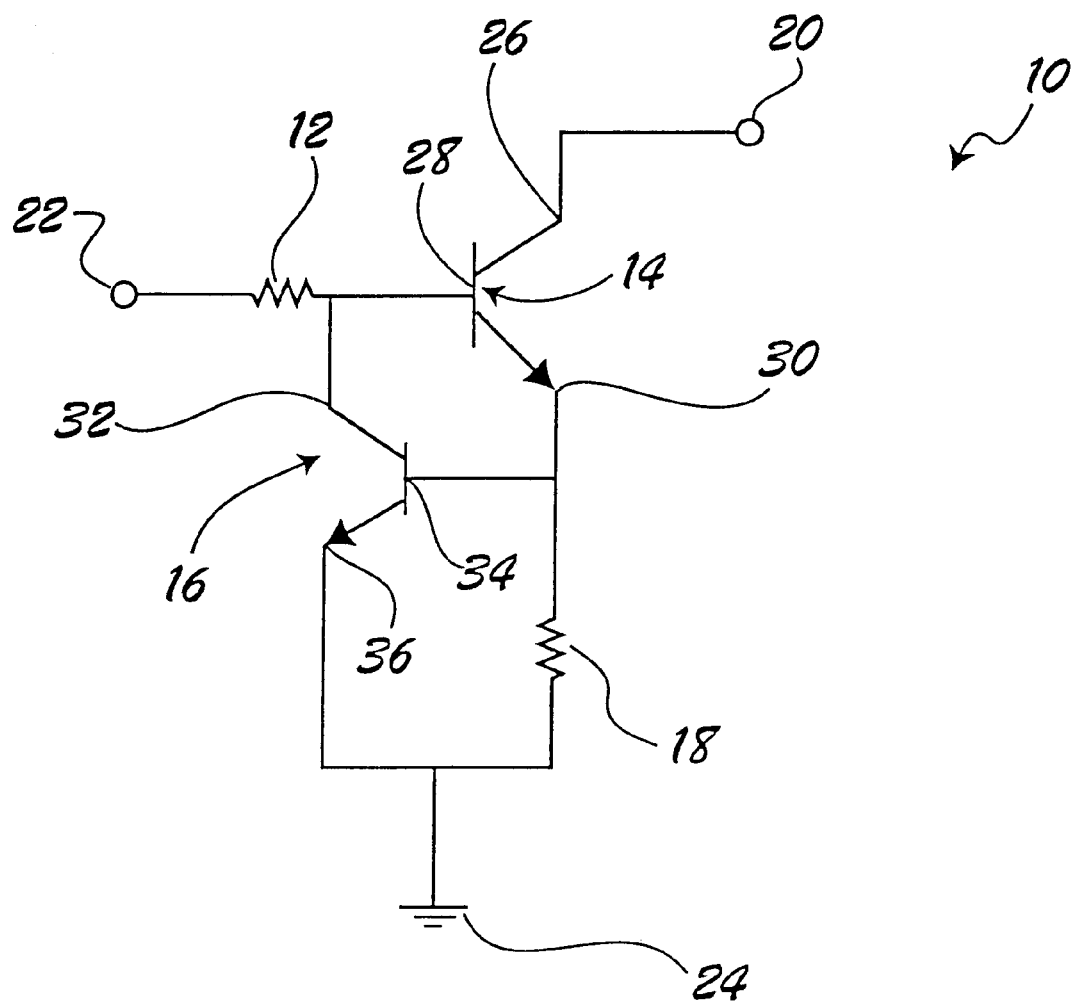
FIG. 1 is a schematic diagram of an open collector output circuit, in accordance with the present invention.
Figure 2:
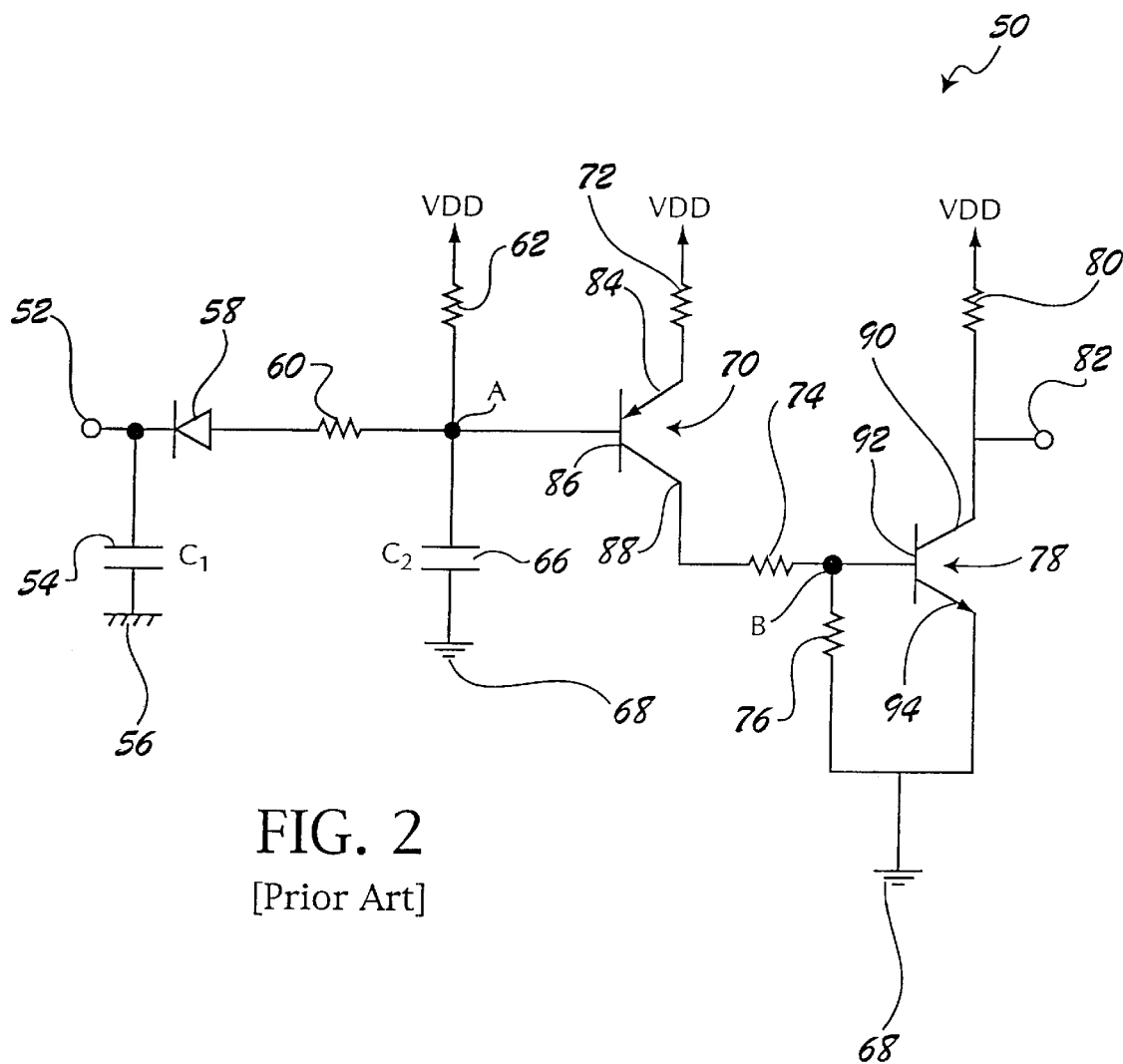
FIG. 2 is a schematic diagram of a conventional monitoring circuit.
Figure 3:
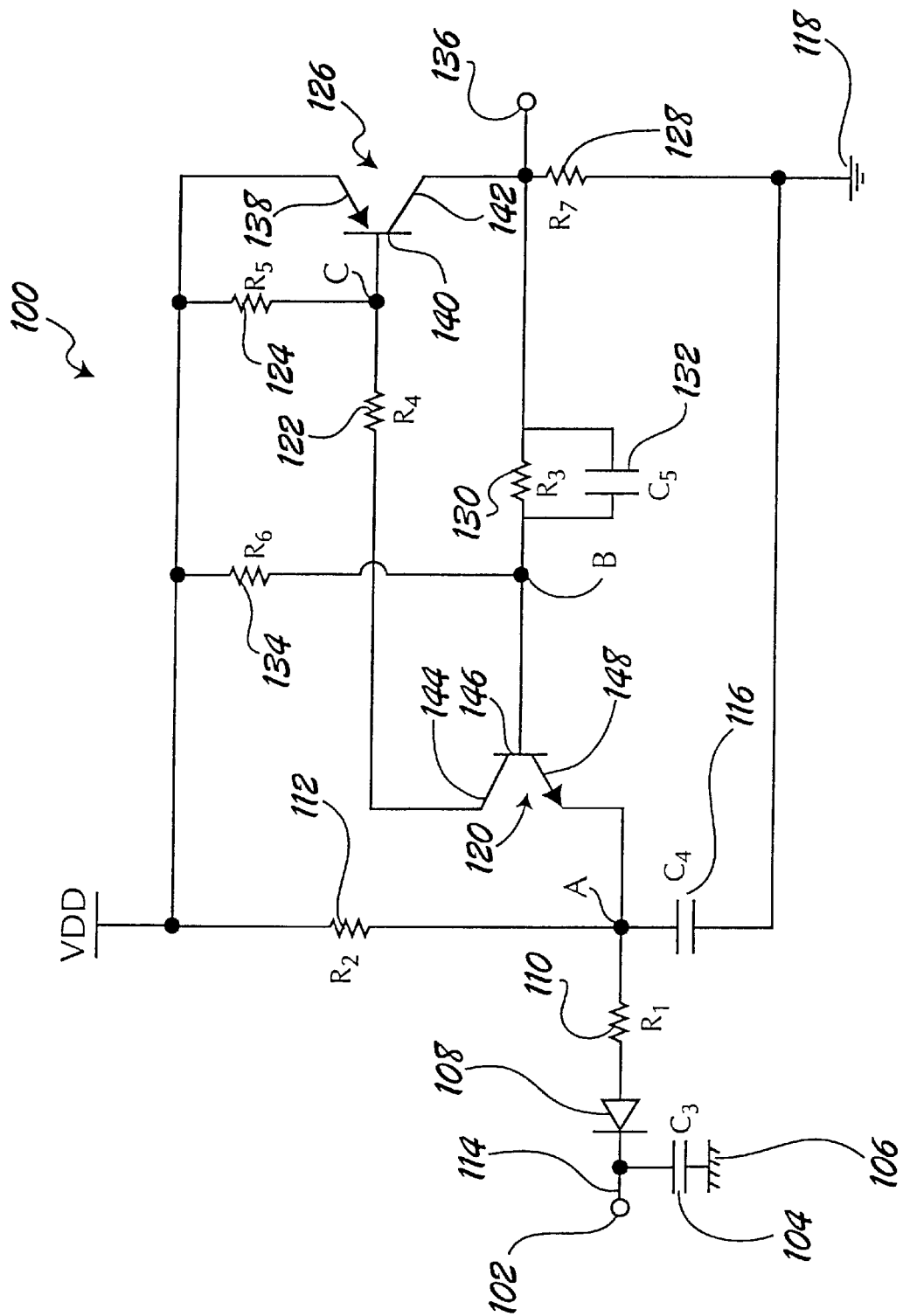
FIG. 3 is a schematic diagram of a monitoring circuit for interfacing the open collector output circuit shown in FIG. 1 with a significant offset voltage, in accordance with the principles of the present invention.

With reference to FIG. 3, a monitoring circuit 100, according to the principles of the present invention, will now be described. The monitoring circuit 100 interfaces with an open collector output circuit 10 shown in FIG. 1 via a first signal line 114 that transmits an output signal from the open collector output circuit 10. The first signal line 114 is connected in parallel to a first capacitor (C3) 104 which is connected to an RF ground 106 on the other end. The first signal line 114 is also connected in series to an isolation diode 108. The isolation diode 108 provides isolation to the open collector output circuit 10 so that if the monitoring circuit 100 has a fault, the open collector output circuit 10 will not become non-functional. The isolation diode 108 is connected to a first resistor (R1) 110, in series on the other end, which provides base drive for a first BJT 120. In accordance with the present invention, an NPN BJT is used for the first BJT 120. However, as would be apparent to one skilled in the art, any equivalents thereof may also be used as the first BJT 120. The first resistor 110 is connected in parallel at node A to a second resistor (R2) 112 and a second capacitor (C4) 116. The second resistor (R2) 112 is connected to VDD and the second capacitor (C4) 116, is connected to ground 118. The present invention preferably uses a VDD of five volts with respect to ground 118.

As mentioned briefly above, the first resistor 110 is connected to the first BJT 120 which includes a base junction 146, an emitter junction 148 and a collector junction 144. The emitter junction 148 of the first BJT 120 is connected to node A, and receives emitter current from the open collector output circuit 10 through the first signal line 114. The base junction 146 and the collector junction 144, respectively, of the first BJT 120 are connected to a second BJT 126 in a loop configuration. In accordance with the present invention, a PNP BJT is used as the second BJT 126. However, one skilled in the art will readily recognize that any equivalents thereof can also be used so long as they are compatible with the first BJT 120.

The second BJT 126 also includes a base junction 140, an emitter junction 138, and a collector junction 142. More specifically, the base junction 146 of the first BJT 120 is connected to the collector junction 142 of the second BJT 126 via a third resistor (R3) 130. An optional capacitor (C5) 132 is connected in parallel to the third resistor (R3) 130 to increase the speed of the monitoring circuit 100. At node B, a sixth resistor (R6) 134 is also connected in parallel to the base junction 146 of the first BJT 120 and the third resistor 130. The other end of the sixth resistor 134 is connected to the power supply, VDD. Furthermore, the collector junction 144 of the first BJT 120 is connected to the base junction 140 of the second BJT 126 via a fourth resistor (R4) 122. At node C, a fifth resistor (R5) 124 is connected in parallel to the base junction 140 of the second BJT 126 and the fourth resistor (R4) 122. Likewise, the other end of the fifth resistor 124 is connected to the power supply, VDD. The collector junction 142 of the second BJT 126 is also connected to a seventh resistor (R7) 128, which is connected to the ECU ground 118 on the other end.

Initially, the open collector output circuit 10 is off and the monitoring circuit 100 receives nearly zero current. In such case, the emitter junction 148 of the first BJT 120 is pulled up to VDD (5 V) by the second resistor 112. The voltage of the base junction 146 of the first BJT 120 is then set by a voltage divider having an equation of the following.

$$Vb = VDD * \frac{R_3 + R_7}{R_3 + R_7 + R_6}$$

Since this voltage is less than VDD (5 V), the base-emitter junction 146–148 of the first BJT 120 is reverse biased and the first BJT 120 is in an OFF state. When the first BJT 120 is in the OFF state, no current flows through the first BJT 120, thus, there is no current flow from the collector junction 144 of the first BJT 120 to the base junction 140 of the second BJT 126. Thus, the second BJT 126 is also in the OFF state. Any other current flowing through the monitoring circuit 100 is pulled down by the seventh resistor 128. The monitoring circuit 100 then outputs a low signal at an output port 136 due to the pull-down of the seventh resistor 128.

As the open collector output circuit 10 turns on, the monitoring circuit 100 conducts current, which, in turn, pulls down the voltage of the emitter junction 148 of the first BJT 120. When enough current is supplied, the voltage of the emitter junction 148 drops down enough to provide an adequate base-emitter drop to turn on the first BJT 120. When the first BJT 120 is turned on, current flows from the collector junction 144 of the first BJT 120 to the base junction 140 of the second BJT 126. This current flow through the first BJT 120 causes a voltage drop in the fifth resistor 124, which subsequently turns on the second BJT 126. When turned on, the second BJT 126 pulls up the output signal to high, or a logical one. In accordance with the present invention, the voltage of the logical one output signal ranges from VDD to a saturation voltage of the second BJT 126.

In addition to the pull up of the output signal, the second BJT 126 also pulls up the third resistor 130 which connects between the collector junction 142 of the second BJT 126 and the base junction 146 of the first BJT 120. The pull-up of the third resistor 130 then changes the biasing of the first BJT 120. More specifically, the biasing of the first BJT 120 changes from the biasing due to the voltage divider described above to that of VDD. Accordingly, the biasing of the base junction 146 of the first BJT 120 becomes strictly dependent on the current flow. The current flow through the third resistor 130 changes direction and adds more base current to the first BJT 120. More base current to the first BJT 120 more fully saturates the first BJT 120, which then provides greater base current to the second BJT 126. The loop configuration of the first and second BJTs 120 and 126, respectively, therefore creates a positive feedback which forces a hard switch point and generates hysteresis.

The threshold from which the output of the monitoring circuit 100 switches from a logical zero (low) to a logical one (high) is a function of a resistor divider having an equation of the following.

$$Vth = VDDx\frac{R_3 + R_7}{R_3 + R_7 + R_6}$$

On the contrary, the threshold at which the output of the monitoring circuit 100 switches from a logical one (high) to a logical zero (low) is a function of the base current of the first BJT 120. The base current of the first BJT 120 is a function of the current which flows through the open collector output circuit 10 illustrated in FIG. 1.

The positive feedback loop of the present invention reduces the time the monitoring circuit 100 is in the linear mode. The positive feedback loop of the present invention also allows the monitoring circuit 100 to maximize the turn-on rate of the digital circuit receiving an input signal from the monitoring circuit 100. Thus, the present invention causes the circuit to function more like a switch and less like an amplifier. By providing the positive feedback loop, the monitoring circuit 100, in accordance with the present invention, provides hysteresis, and allows the reduction in noise occurring through the single switching point during the transfer of data signals due to the ground differential between two different modules.

It will be apparent to those skilled in the art that various modifications and adaptations can be made to the present invention without departing from the spirit and scope of the invention. Thus, it is intended that the present invention covers the modifications and adaptations of this invention, provided they come within the scope of the appended claims and their equivalents.

What is claimed is:

1. A monitoring circuit for interfacing an open collector output stage of an open collector circuit having a first ground with a voltage offset, said voltage offset preventing direct interfacing with a digital input of an adjacent digital circuit, said monitoring circuit comprising:

a first transistor connected to the open collector circuit wherein said first transistor has a second ground that is different from the first ground, said first and second grounds creating an appreciable voltage offset therebetween when said first transistor interfaces with the open collector circuit; and a second transistor connected to said first transistor in a loop configuration, wherein at least one of said first and second transistors increase base current drive to the other of said first and second transistors, thereby maximizing a turn-on rate of the digital circuit.

2. The monitoring circuit of claim 1 wherein said first and second transistors provide a positive feedback on a current flow within said monitoring circuit, thereby generating hysteresis.

3. The monitoring circuit of claim 1 wherein each of said first and second transistors includes a collector junction, a base junction and an emitter junction, said collector junction of said first transistor provides base current drive for said second transistor.

4. The monitoring circuit of claim 3 further comprising a diode connected to said emitter junction of said first transistor for providing an isolation of said open circuit from said first and second transistors.

5. The monitoring circuit of claim 3 further comprising a resistor connecting between a collector junction of said second transistor and a base junction of said first transistor.

6. The monitoring circuit of claim 1 wherein each of said first and second transistors includes a collector junction, a base junction and an emitter junction, said collector junction of said second transistor provides base current drive for said first transistor.

7. The monitoring circuit of claim 6 further comprising:
a resistor connected between said collector junction of said second transistor and said base junction of said first transistor for changing a biasing of said first transistor.

8. The monitoring circuit of claim 7, further comprising:
a capacitor connected in parallel to said resistor for further increasing said turn-on rate of said digital circuit.

9. The monitoring circuit of claim 1 wherein said first transistor is an npn bipolar junction transistor.

10. The monitoring circuit of claim 1 wherein said second transistor is a pnp bipolar junction transistor.

11. A monitoring circuit interfacing an open collector output stage with a voltage offset, said voltage offset preventing direct interfacing with a digital input, said circuit comprising:
an open collector circuit having a first ground;
a first bipolar junction transistor connected to said open collector circuit, wherein said first bipolar junction has a second ground that is different from said first ground, said first and second ground creating an appreciable voltage offset therebetween when said bipolar junction transistor is interfaced with said open collector circuit;
a second bipolar junction transistor connected to said first bipolar junction transistor in a loop configuration,
wherein said first bipolar junction transistor provides base current drive to said second bipolar junction transistor and said second bipolar junction transistor provides base current drive to said first bipolar junction transistor.

12. The monitoring circuit of claim 11 wherein said first and second bipolar junction transistors provide a positive feedback on a current flow within said monitoring circuit, thereby generating hysteresis.

13. The monitoring circuit of claim 11 wherein each of said first and second bipolar junction transistors includes a collector junction, a base junction and an emitter junction, said collector junction of said first bipolar junction transistor provides base current drive for said second bipolar junction transistor.

14. The monitoring circuit of claim 13 further comprising a diode connected to said emitter junction of said first bipolar junction transistor for providing an isolation of said open circuit from said first and second bipolar junction transistor.

15. The monitoring circuit of claim 13 further comprising:
a resistor connected between said collector junction of said second bipolar junction transistor and said base junction of said first bipolar junction transistor for changing a biasing of said first bipolar junction transistor.

16. The monitoring circuit of claim 15, further comprising:
a capacitor connected in parallel to said resistor for further increasing said turn-on rate of said digital circuit.

17. The monitoring circuit of claim 11 wherein each of said first and second bipolar junction transistors includes a collector junction, a base junction and an emitter junction, said collector junction of said second bipolar junction transistor provides base current drive for said first bipolar junction transistor.

18. A monitoring circuit interfacing an open collector output stage with a voltage offset, said voltage offset preventing direct interfacing with a digital input, said circuit comprising:
an open collector circuit having a first ground;
an npn bipolar junction transistor connected to said open collector circuit, wherein said first bipolar junction has a second ground that is different from said first ground, said first and second ground creating an appreciable voltage offset therebetween when said npn bipolar junction transistor is interfaced with said open collector circuit;
a pnp bipolar junction transistor connected to said non bipolar junction transistor opposite of said open collector circuit, said pnp bipolar junction transistor and said npn bipolar junction transistor forming a positive feedback on a current flow within said monitoring circuit,
wherein said npn bipolar junction transistor provides base current drive to said pnp bipolar junction transistor and said pnp bipolar junction transistor provides base current drive to said npn bipolar junction transistor.

* * * * *